United States Patent
Lee et al.

(10) Patent No.: US 10,013,211 B2
(45) Date of Patent: Jul. 3, 2018

(54) STORAGE DEVICES INCLUDING NONVOLATILE MEMORY DEVICES AND ACCESS METHODS FOR NONVOLATILE MEMORY DEVICES

(71) Applicants: Donghwan Lee, Namyangju-si (KR); Junjin Kong, Yongin-si (KR); Seongnam Kwon, Bucheon-si (KR); Seungkyung Ro, Anyang-si (KR); Changkyu Seol, Osan-si (KR); Hong Rak Son, Anyang-si (KR); Pilsang Yoon, Hwaseong-si (KR); Donggi Lee, Yongin-si (KR); Heewon Lee, Seoul (KR)

(72) Inventors: Donghwan Lee, Namyangju-si (KR); Junjin Kong, Yongin-si (KR); Seongnam Kwon, Bucheon-si (KR); Seungkyung Ro, Anyang-si (KR); Changkyu Seol, Osan-si (KR); Hong Rak Son, Anyang-si (KR); Pilsang Yoon, Hwaseong-si (KR); Donggi Lee, Yongin-si (KR); Heewon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/605,404

(22) Filed: May 25, 2017

(65) Prior Publication Data
US 2018/0067697 A1 Mar. 8, 2018

(30) Foreign Application Priority Data
Sep. 6, 2016 (KR) .......................... 10-2016-0114495

(51) Int. Cl.
*G11C 7/00* (2006.01)
*G06F 3/06* (2006.01)
*G06N 99/00* (2010.01)

(52) U.S. Cl.
CPC ............ *G06F 3/0659* (2013.01); *G06F 3/061* (2013.01); *G06F 3/0656* (2013.01); *G06F 3/0679* (2013.01); *G06N 99/005* (2013.01)

(58) Field of Classification Search
CPC ....... G11C 7/1051; G11C 7/1078; G11C 7/22; G11C 7/106; G11C 7/1057
USPC ..... 365/189.05, 189.14, 189.15, 189.16, 226
See application file for complete search history.

(56) References Cited

U.S. PATENT DOCUMENTS

| | | | |
|---|---|---|---|
| 7,243,186 B2 | 7/2007 | Liang et al. |
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,725,929 B1 | 5/2014 | Yang et al. |

(Continued)

*Primary Examiner* — Son Dinh
(74) *Attorney, Agent, or Firm* — Myers Bigel, P.A.

(57) ABSTRACT

A storage device may include a nonvolatile memory device, a buffer memory, and a controller. The controller may perform first accesses on the nonvolatile memory device using the buffer memory, collect access result information and access environment information of the first accesses in the buffer memory, and generate an access classifier that predicts a result of a second access to the nonvolatile memory device by performing machine learning based on the access result information and the access environment information collected in the buffer memory.

19 Claims, 18 Drawing Sheets

(56) References Cited

U.S. PATENT DOCUMENTS

| | | |
|---|---|---|
| 9,171,264 B2 | 10/2015 | Finocchio et al. |
| 9,236,888 B2 | 1/2016 | Yamazaki et al. |
| 9,256,371 B2 | 2/2016 | Franceschini et al. |
| 9,262,319 B2 | 2/2016 | Ryan et al. |
| 2011/0233648 A1 | 9/2011 | Seol et al. |
| 2012/0081959 A1* | 4/2012 | Lee .................. G11C 11/5642 365/185.09 |
| 2014/0101372 A1* | 4/2014 | Jung ................. G06F 12/0253 711/103 |
| 2014/0122381 A1 | 5/2014 | Nowozin |
| 2014/0229131 A1 | 8/2014 | Cohen et al. |
| 2014/0281820 A1 | 9/2014 | Alrod et al. |
| 2015/0287453 A1 | 10/2015 | Wu et al. |

\* cited by examiner

FIG. 7

| Access Result Information | - Whether number of on cells for VR1 is greater than threshold value<br>- Whether number of off cells for VR2 is greater than threshold value |
|---|---|
| Access Environment Information | - Target block<br>- Target SSL<br>- Target WL (Height)<br>- Temperature<br>- Time stamp<br>- P/E cycle<br>- Read count |

FIG. 9

| Access Result Information | - Read level<br>- Read pass level<br>- Whether to perform soft decision<br>- BER<br>- Program start level<br>- Program increment level<br>- Program pass level<br>- Number of program loops<br>- Erase start level<br>- Erase increment level<br>- Number of erase loops |
|---|---|
| Access Environment Information | - Target block<br>- Target SSL<br>- Target WL (Height)<br>- Target logical page<br>- Temperature<br>- Time stamp<br>- P/E cycle<br>- Read count |

FIG. 11

| Access Result Information | - Whether number of dummy cells/selection transistors outside RNG is greater than threshold value |
|---|---|
| Access Environment Information | - Target block<br>- Target SSL/GSL<br>- Target WL (DMC)<br>- Temperature<br>- Time stamp<br>- P/E cycle<br>- Read count |

FIG. 13

| Access Result Information | - Whether BER is greater than threshold value |
|---|---|
| Access Environment Information | - Target block<br>- Target SSL<br>- Target WL (Height)<br>- Temperature<br>- Time stamp<br>- P/E cycle<br>- Read count<br>- Number of on cells for VR1<br>- Number of off cells for VR2 |

STORAGE DEVICES INCLUDING NONVOLATILE MEMORY DEVICES AND ACCESS METHODS FOR NONVOLATILE MEMORY DEVICES

CROSS-REFERENCE TO RELATED APPLICATIONS

This application claims priority under 35 U.S.C. § 119 to Korean Patent Application No. 10-2016-0114495 filed Sep. 6, 2016 in the Korean Intellectual Property Office, the entire contents of which are hereby incorporated by reference herein in their entirety.

BACKGROUND

Embodiments of the inventive concepts relate to semiconductor devices, and more particularly, to storage devices including nonvolatile memory devices and access methods for the nonvolatile memory devices.

A storage device may include a nonvolatile memory. A storage device including a nonvolatile memory may retain data stored therein even at power-off, therefore the storage device including a nonvolatile memory may be advantageous for storing data for a long time. A storage device may be used as main storage in various electronic devices such as a computer, a smartphone, and a smart pad.

A pattern of performing data reading and writing on storage devices may vary according to data usage patterns of users and environments in which the data is used. The operating performance of the storage devices may vary if the pattern of performing data reading and writing on the storage devices varies.

Manufacturers of storage devices may set an algorithm for internal operations (e.g., write and read operations) thereof based on average usage patterns and use environments. If the average usage patterns and use environments are applied to the storage devices, the storage devices may fail to provide optimum operating performance for a particular user who varies from the average usage patterns and use environments.

SUMMARY

Embodiments of the inventive concepts may provide storage devices and access methods for nonvolatile memory devices that provide optimum or improved operating performance to one or more users.

According to some embodiments of the inventive concepts, storage devices are provided. A storage device may include a nonvolatile memory device, a buffer memory, and a controller. The controller may perform operations including performing first accesses on the nonvolatile memory device by using the buffer memory, collecting access result information and access environment information of the first accesses in the buffer memory, and generating an access classifier that predicts a result of a second access to the nonvolatile memory device by performing machine learning based on the access result information and the access environment information collected in the buffer memory.

According to some embodiments of the inventive concepts, a storage device may include a nonvolatile memory device, a buffer memory, a controller, and a processing unit. The controller may be configured to perform first accesses on the nonvolatile memory device using the buffer memory. The processing unit may be configured to collect access result information and access environment information of the first accesses in the buffer memory and to generate an access classifier that predicts a result of a performance of a second access to the nonvolatile memory device by performing machine learning based on the access result information and the access environment information collected in the buffer memory. The controller may be configured to selectively perform the second access on the nonvolatile memory device based on the access classifier.

According to some embodiments of the inventive concepts, a storage device may include a nonvolatile memory device and a controller. The controller may be configured to selectively perform a read reclaim operation or a reprogram operation on the nonvolatile memory device based on a predicted result of a future access to the nonvolatile memory device. The predicted result may be based on access information that is collected by the controller from previous accesses to the nonvolatile memory device.

According to some embodiments of the inventive concepts, access methods of nonvolatile memory devices may be provided. An access method of a nonvolatile memory device may include performing first accesses on the nonvolatile memory device and collecting access result information and access environment information of the first accesses, generating an access classifier by performing machine learning based on the collected access result information and access environment information, and before performing a second access on the nonvolatile memory device, predicting the result of the second access by using access environment information of the second access and the access classifier.

BRIEF DESCRIPTION OF THE FIGURES

The inventive concepts will become more clearly understood in view of the detailed description and the accompanying drawings, wherein like reference numerals may refer to like parts throughout the various figures unless otherwise specified.

FIG. 7 is a table illustrating access result information and access environment information when machine learning is applied to a reliability verification read operation according to some embodiments of the inventive concepts.

FIG. 9 is a table illustrating access result information and access environment information when machine learning is applied to a read operation, a write operation, or an erase operation according to some embodiments of the inventive concepts.

FIG. 11 is a table illustrating access result information and access environment information when machine learning is applied to a check operation according to some embodiments of the inventive concepts.

FIG. 13 is a table illustrating results of access operations classified by using a result of a sub access operation as the access environment information according to some embodiments of the inventive concepts.

DETAILED DESCRIPTION

Figure 1:
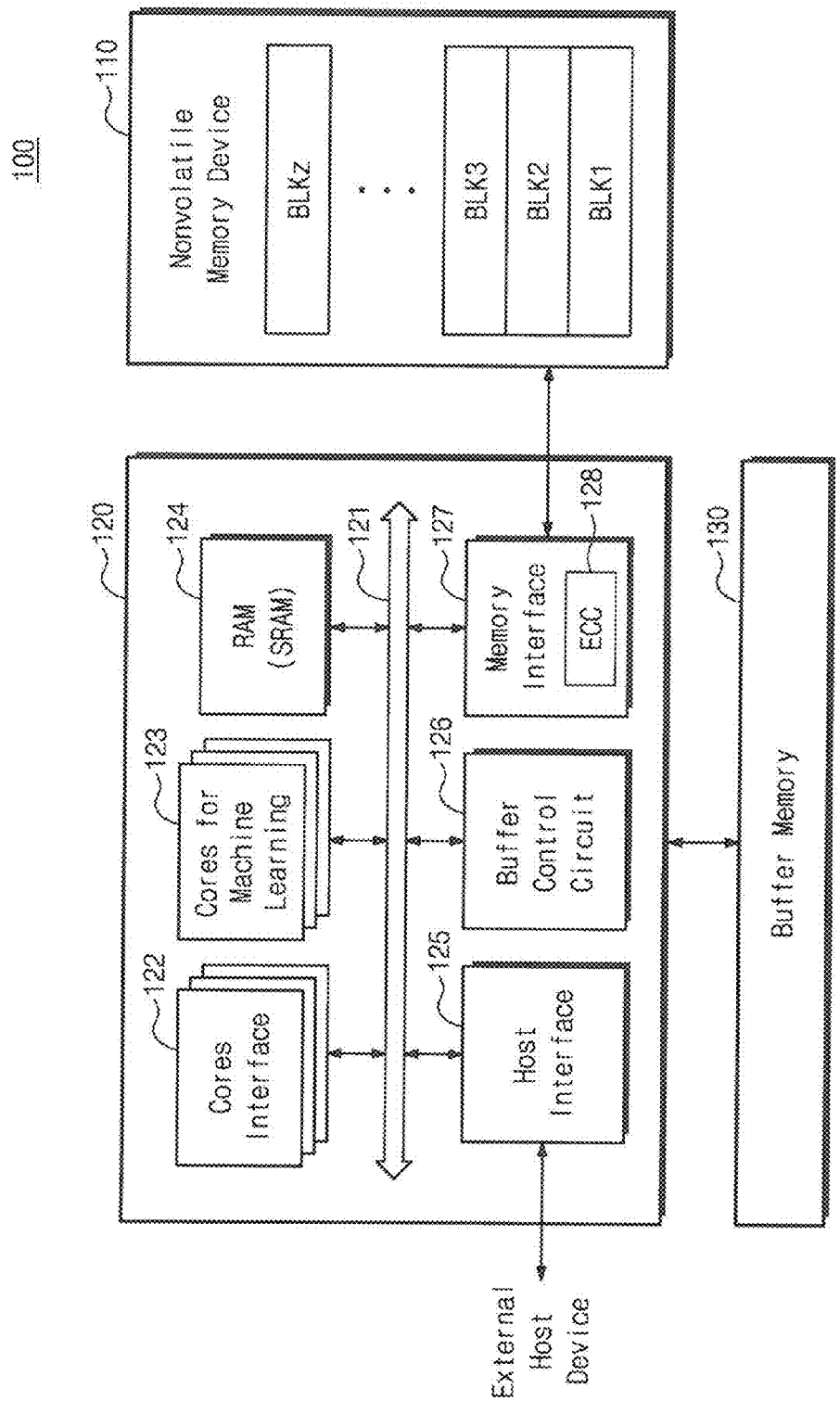
FIG. 1 is a block diagram illustrating a storage device according to some embodiments of the inventive concepts.

The inventive concepts will be described more fully hereinafter with reference to accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "connected to" or "on" another element, it can be directly connected to or on the other element or intervening elements may be present. In contrast, the term "directly" means that there are no intervening elements. Additionally, embodiments that are described in the detailed description may be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Embodiments of the present inventive concepts explained and illustrated herein may include their complementary counterparts. The same reference numerals or the same reference designators denote the same elements throughout the specification.

FIG. 1 is a block diagram illustrating a storage device according to some embodiments of the inventive concepts. Referring to FIG. 1, a storage device 100 may include a nonvolatile memory device 110, a controller 120, and a buffer memory 130.

The nonvolatile memory device 110 may perform a write operation, a read operation, and an erase operation under control of the controller 120. The nonvolatile memory device 110 may receive a write command, an address, and data from the controller 120 and may write the data in a storage space corresponding to the address. The nonvolatile memory device 110 may receive a read command and an address from the controller 120, may read data from a storage space corresponding to the address, and may output the read data to the controller 120. The nonvolatile memory device 10 may receive an erase command and an address from the controller 120 and may erase data of a storage space corresponding to the address.

The nonvolatile memory device 110 may include a plurality of memory blocks BLK1 to BLKz. Each of the memory blocks BLK1 to BLKz may include a plurality of memory cells. The memory cells may form a storage space of the nonvolatile memory device 110. Each of the memory blocks BLK1 to BLKz may further include selection transistors that allow memory cells to be selected independently of each other. The memory blocks BLK1 to BLKz may be distinguished according to an operational characteristic or a structural characteristic of the nonvolatile memory device 110.

The nonvolatile memory device 110 may include a flash memory, a phase-change random access memory (PRAM), a ferroelectric RAM (FeRAM), a magnetic RAM (MRAM), a resistive RAM (RRAM), etc.

The controller 120 may access the nonvolatile memory device 110 and the buffer memory 130. The controller 120 may perform a write operation, a read operation, and an erase operation in response to a request of an external host device. The controller 120 may write write-requested data in the nonvolatile memory device 110 and may read and output read-requested data from the nonvolatile memory device 110.

The controller 120 may manage the storage device 100 by using the buffer memory 130. For example, the controller 120 may temporarily store data to be written in the nonvolatile memory device 110 or data read from the nonvolatile memory device 110 in the buffer memory 130. The controller 120 may load metadata, which is needed to manage the nonvolatile memory device 110, on the buffer memory 130.

The controller 120 may collect access environment information and access result information upon accessing the nonvolatile memory device 110. For example, the access environment information and the access result information may be collected in the buffer memory 130. The controller 120 may perform machine learning based on the access environment information and the access result information collected in the buffer memory 130. For example, the controller 120 may perform machine learning based on access environment information and access result information that are associated with two or more accesses. The controller 120 may select a next access method, whether or not of execution, and access parameters based on the result of the machine learning.

The controller 120 may include a bus 121, cores 122 and 123, a RAM 124, a host interface 125, a buffer control circuit 126, and a memory interface 127.

The bus 121 may be configured to provide a channel among elements of the controller 120.

Some cores 122 of the cores 122 and 123 may be used (or assigned or specified) to manage the storage device 100, and the other cores 123 thereof may be used (or assigned or specified) to perform the machine learning.

The cores 122 may control overall operations of the controller 120 and may execute a logical operation. The cores 122 may communicate with the external host device through the host interface 125, may communicate with the nonvolatile memory device 110 through the memory interface 127, and may communicate with the buffer memory 130 through the buffer control circuit 126. The cores 122 may control the storage device 100 by using the RAM 124 as a working memory, a cache memory, and/or a buffer memory. The cores 122 may request the cores 123 to predict a result associated with at least some of accesses requested by the external host device or accesses made by an internal policy. The cores 122 may select whether or not to perform an execution, a way to perform the execution, processes of execution, and execution parameters of the at least some accesses based on a prediction result received from the cores 123.

The cores 123 may perform machine learning based on access environment information and access result information stored in the buffer memory 130. For example, the cores 123 may generate (or update) learning results, such as decision tree, neural network, and support vector machine, as an access classifier by performing machine learning. The cores 123 may load the access classifier on the RAM 124 or the buffer memory 130 for driving. After access classifiers are generated, the cores 123 may predict results, which are associated with at least some accesses, by using the access classifiers in response to a request of the cores 122. The cores 123 may transfer the prediction result to the cores 122. The cores 123 may write access classifiers in the nonvolatile memory device 110 periodically or when power-off of the storage device 100 is sensed. For example, access classifiers may be written in a memory block that is allocated for storing metadata information, of the memory blocks BLK1 to BLKz. When an electric power is supplied to the storage device 100, the cores 123 may read access classifiers from the nonvolatile memory device 110 and may load the read access classifiers on the buffer memory 130 or the RAM 124.

The RAM 124 may be used as a working memory, a cache memory, and/or a buffer memory of the cores 122 and 123.

The RAM 124 may store codes and/or commands that the cores 122 and 123 may execute. The RAM 124 may store data processed by the cores 122 and 123. In some embodiments, the RAM 124 may include a static RAM (SRAM).

The host interface 125 may be configured to communicate with the external host device under control of the cores 122. The host interface 125 may be configured to convey communications by using at least one of various communication manners, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer control circuit 126 may control the buffer memory 130 under control of the cores 122.

The memory interface 127 may configured to communicate with the nonvolatile memory device 110 in response to control of the cores 122. The memory interface 127 may convey a command, an address, and data to the nonvolatile memory device 110 through the input/output channel. The memory interface 127 may convey a control signal to the nonvolatile memory device 110 through the control channel.

The memory interface 127 may include an error correction block 128. The error correction block 128 may include an error correction code ECC. The error correction block 128 may perform error correction. The error correction block 128 may perform error correction encoding based on data to be written in the nonvolatile memory device 110 through the memory interface 127. The error correction encoded data may be provided to the nonvolatile memory device 110 through the memory interface 127. The error correction block 128 may perform error correction decoding on data received through the memory interface 127 from the nonvolatile memory device 110.

In some embodiments, if the storage device 100 does not include the buffer memory 130, the controller 120 may not include the buffer control circuit 126.

Figure 2:
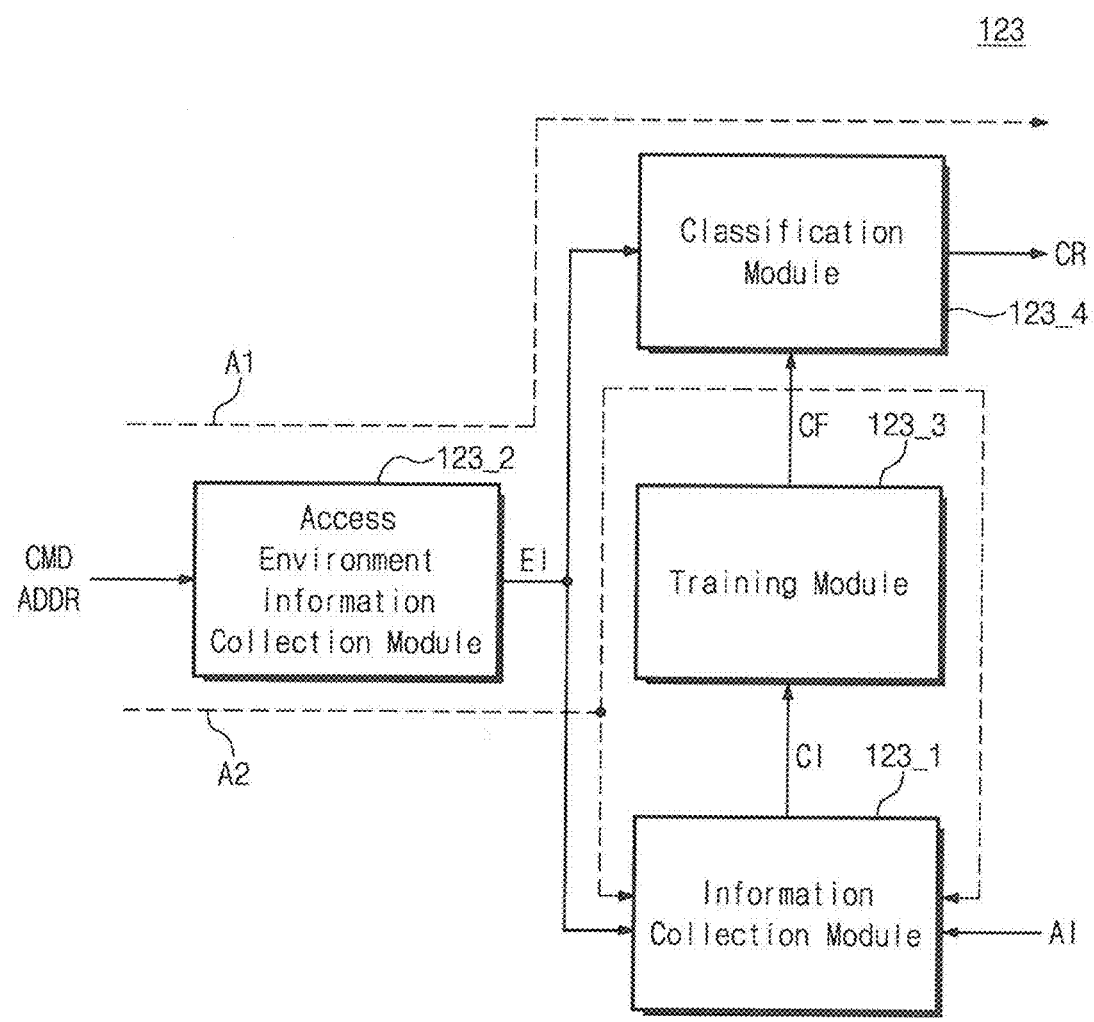
FIG. 2 is a block diagram illustrating modules implemented by the cores for machine learning of FIG. 1 according to some embodiments of the inventive concepts.

FIG. 2 is a block diagram illustrating modules implemented by the cores for machine learning of FIG. 1 according to some embodiments of the inventive concepts. Referring to FIGS. 1 and 2, the cores 123 may include an information collection module 123_1, an access environment information collection module 123_2, a training module 123_3, and a classification module 123_4.

The information collection module 123_1 may collect access result information AI that is generated when the controller 120 accesses the nonvolatile memory device 110. For example, the information collection module 123_1 may collect the access result information AI that is associated with accesses, a kind of which may be specified by the cores 122 or 123, of various accesses to the nonvolatile memory device 110. Also, pieces of result information, a kind of which may be specified by the cores 122 or 123, of various pieces of result information generated by respective accesses, may be collected as the access result information AI. Also, the information collection module 123_1 may collect access environment information EI that is associated with accesses of a specified kind. The collected access result information AI may be stored in the buffer memory 130. In other words, the cores 122 or 123 may specify one or more kinds of information, including result information, pieces of result information, and/or environment information, to be stored in the buffer memory 130.

The access environment information collection module 123_2 may receive a command CMD and/or an address ADDR that is associated with an access, the kind of which may be specified by the cores 122 or 123, of accesses processed by the cores 122. The access environment information collection module 123_2 may collect the access environment information EI based on the command CMD and/or the address ADDR. The collected access environment information EI may be transferred to the information collection module 123_1 and/or the classification module 123_4.

The training module 123_3 may perform machine learning when the collected access environment information EI and the collected access result information AI reach a training condition. As the result of the machine learning, the training mode 123_3 may generate a new access classifier CF or may update a previous access classifier CF. The new access classifier CF may be stored in the buffer memory 130 or the RAM 124 and may transfer the authority to control the new access classifier CF to the classification module 123_4. In some embodiments, the access classifier CF may be called a "classifier" in terms of predicting a result corresponding to a classified access, however functions and features of the access classifier CF may not be limited by the term "classifier".

The classification module 123_4 may receive the environment information EI from the access environment information collection module 123_2. The classification module 123_4 may output a classification result CR based on the environment information EI and the access classifier CF. The classification result CR may be transferred to the cores 122.

In FIG. 2, two examples in which pieces of information are processed by the modules 123_1 to 123_4 are illustrated by first and second arrows A1 and A2.

Referring to the first arrow A1, result prediction of a first specific access may be requested from the cores 122. The access environment information collection module 123_2 may collect the environment information EI. The classification module 123_4 may obtain the classification result CR by using the environment information EI and the access classifier CF. The classification result CR may be transferred to the cores 122. If it is determined that the cores 122 not to perform an access based on the classification result CR, the access result information AI may not be collected. Accordingly, the access environment information EI may not be collected by the information collection module 123_1 as well.

Referring to the second arrow A2, result prediction of a second specific access may be requested from the cores 122. The access environment information collection module 123_2 may collect the environment information EI. The classification module 123_4 may obtain the classification result CR by using the environment information EI and the access classifier CF. The classification result CR may be transferred to the cores 122. If it is determined that the cores 122 determine to perform an access based on the classification result CR, the access result information AI may be collected. Accordingly, the information collection module 123_1 may collect the access environment information EI and the access result information AI.

Figure 3:
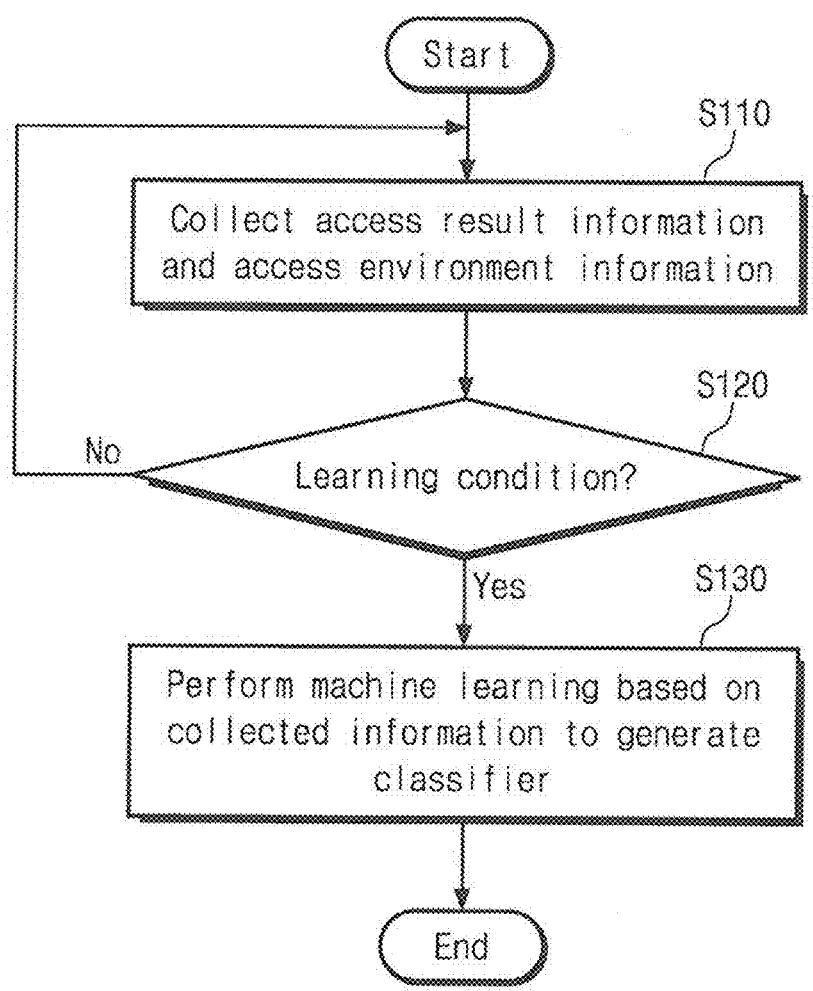
FIG. 3 is a flowchart illustrating operations of operating methods of storage devices according to some embodiments of the inventive concepts.

FIG. 3 is a flowchart illustrating operations of operating methods of storage devices according to some embodiments of the inventive concepts. Referring to FIGS. 1 to 3, in an operation S110, the information collection module 123_1 may collect the access result information AI and the access environment information EI of an access to the nonvolatile memory device 110 together with the access environment information collection module 123_2. The access may include a write operation, a read operation, or an erase operation.

In an operation S120, the training mode 123_3 may determine whether a learning condition is satisfied. For example, the learning condition may be satisfied during a predetermined time period, when the size of the collected access result information AI and the collected access environment information EI reaches a predetermined size, during an idle time (or when an idle time comes), when a power-off is sensed, and/or when a storage capacity of a buffer memory is determined to be insufficient. If the learning condition is not satisfied, the process may proceed back to operation S110 to continue to collect information. If the learning condition is satisfied, the process may proceed to an operation S130.

In the operation S130, the training module 123_3 may perform machine learning based on the collected access result information AI and the collected access environment information EI to generate the access classifier CF. For example, the training module 123_3 may generate a new access classifier CF or may change a parameter, such as a weight, of a previous access classifier.

Figure 4:
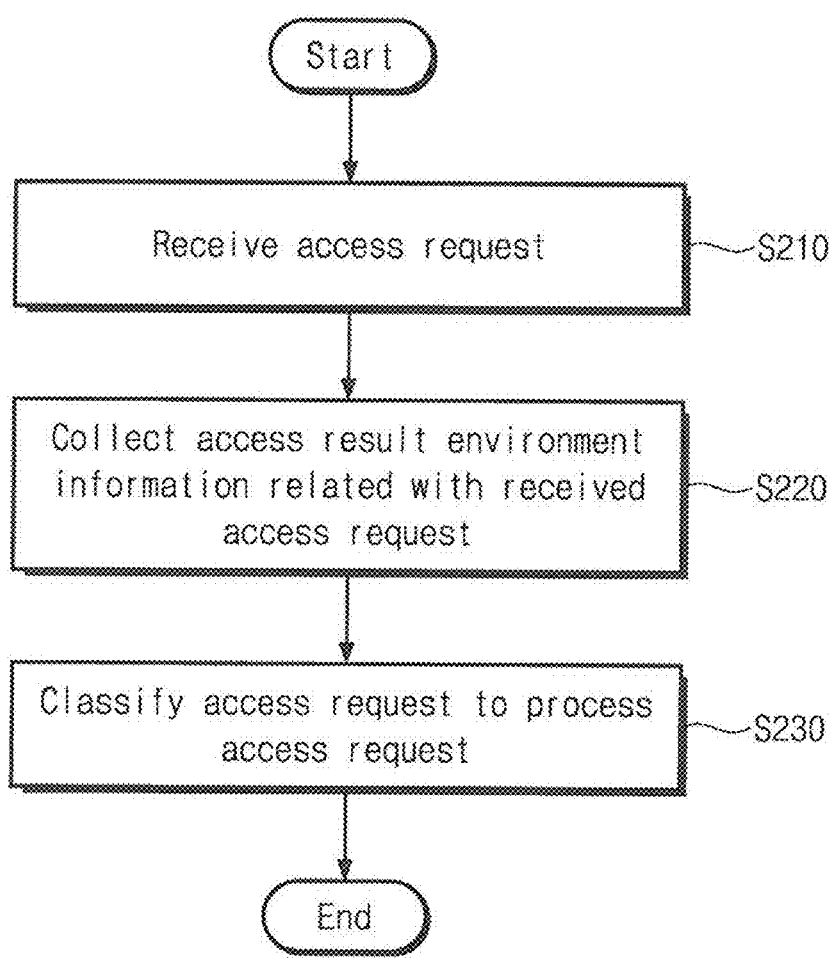
FIG. 4 is a flowchart illustrating operations of operating methods in which a storage device predicts (or classifies) an access result of a new access request by using an access classifier, according to some embodiments of the inventive concepts.

FIG. 4 is a flowchart illustrating operations of operating methods in which a storage device predicts (or classifies) an access result of a new access request by using an access classifier, according to some embodiments of the inventive concepts. Referring to FIGS. 1, 2, and 4, in an operation S210, the cores 122 may receive an access request from an external host device or may generate an access request based on an internal policy. Before the cores 122 perform an access in response to the access request, the cores 122 may request the cores 123 to predict an access result. For example, the access environment information collection module 123_2 may receive the access request including the command CMD and the address ADDR.

In an operation S220, the access environment information collection module 123_2 may collect the access environment information EI that is associated with the received access request.

In an operation S230, the classification module 123_4 may obtain the classification result CR by using the access environment information EI and the access classifier CF. The cores 122 may process the access request based on the classification result CR. For example, the cores 122 may determine whether to perform an access based on the classification result CR. Also, when the cores 122 perform an access, the cores 122 may select (or change) various parameters such as voltages used in the nonvolatile memory device 110 and/or times based on the classification result CR.

Figure 5:
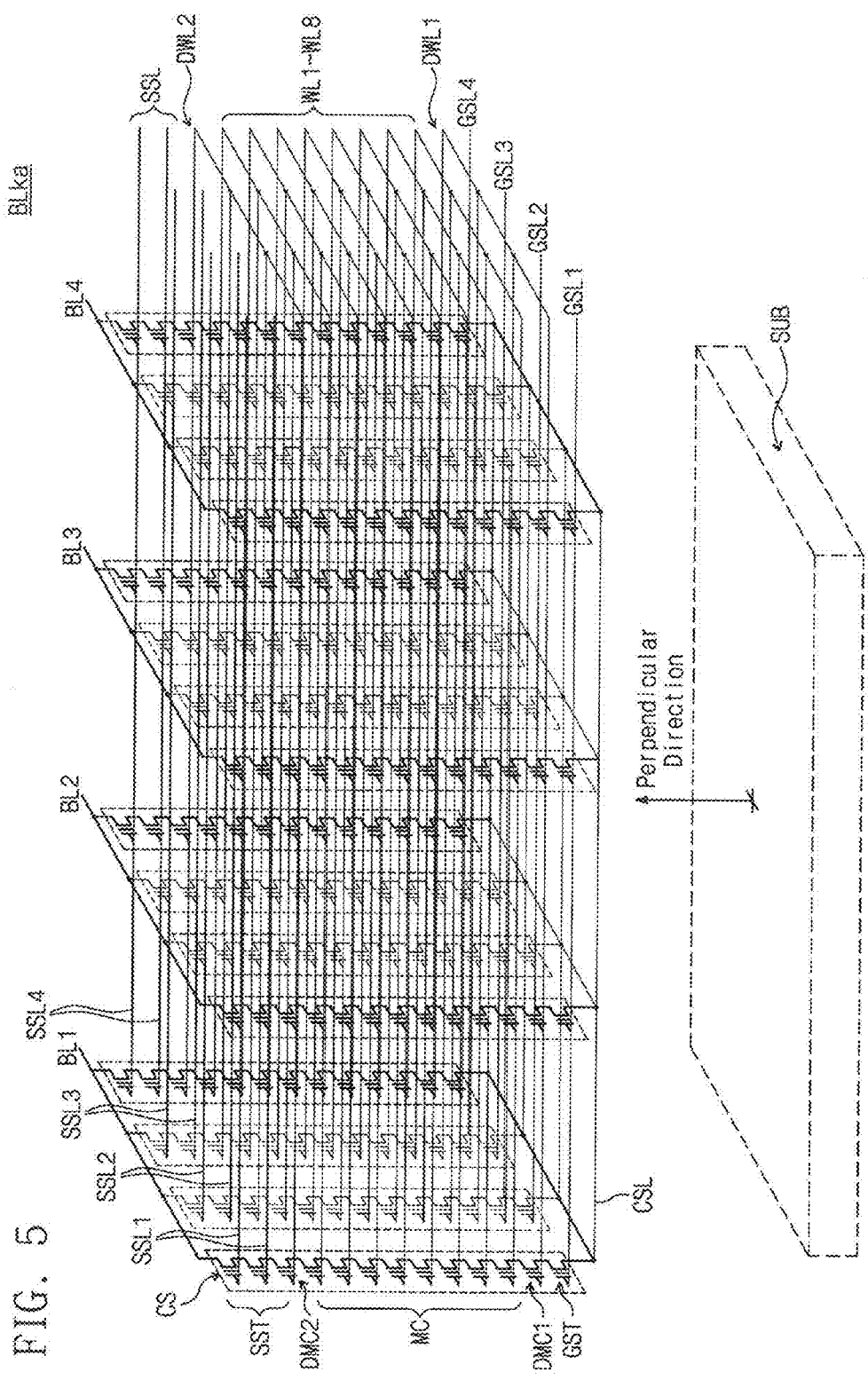
FIG. 5 is a perspective view schematically illustrating a memory block according to some embodiments of the inventive concepts.

FIG. 5 is a perspective view schematically illustrating a memory block according to some embodiments of the inventive concepts. Referring to FIGS. 1 and 5, a memory block BLKa may include a plurality of cell strings CS arranged on a substrate SUB in rows and columns. The cell strings CS may be connected in common to a common source line CSL on (or in) the substrate SUB. In FIG. 5, a location of the substrate SUB is exemplified to help understand a structure of the memory block BLKa. FIG. 5 illustrates the common source line CSL connected to lower ends of the cell strings CS. However, the common source line CSL is sufficient as being electrically connected to lower ends of the cell strings CS and embodiments of the inventive concepts may not be limited to the common source line CSL being physically located at the lower ends of the cell strings CS. In FIG. 5 the cell strings CS are arranged in a four-by-four matrix. However, according to some embodiments, the number and/or arrangement of cell strings CS in the memory block BLKa may increase or decrease.

Cell strings of a row may be connected to a corresponding one of first to fourth ground selection lines GSL1 to GSL4 and a corresponding one of first to fourth string selection lines SSL1 to SSL4. Cell strings of a column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be light.

Each cell string CS may include at least one ground selection transistor GST connected to a corresponding ground selection line, a first dummy memory cell DMC1 connected to a first dummy word line DWL1, a plurality of memory cells MC respectively connected to a plurality of word lines WL1 to WL8, a second dummy memory cell DMC2 connected to a second dummy word line DWL2, and string selection transistors SST respectively connected to string selection lines SSL. In each cell string CS, the ground selection transistor GST, the first dummy memory cell DMC1, the memory cells MC, the second dummy memory cell DMC2, and the string selection transistors SST may be serially connected to each other along a direction perpendicular to the substrate SUB and may be sequentially stacked along a direction perpendicular to the substrate SUB.

In some embodiments, as illustrated in FIG. 5, one or more dummy memory cells may be arranged between the ground selection transistor GST and the memory cells MC in each cell string CS. In each cell string CS, one or more dummy memory cells may be arranged between the string selection transistors SST and the memory cells MC. In some embodiments, one or more dummy memory cells may be arranged between the memory cells MC. The dummy memory cells may have the same structure as the memory cells MC and may not be programmed (e.g., program inhibited) or may be programmed differently from the memory cells MC. For example, when memory cells are programmed to form two or more threshold voltage distributions, the dummy memory cells may be programmed to have one threshold voltage distribution range or to have threshold voltage distributions of which the number is less than that of the memory cells MC.

Gates of the memory cells of the cell strings CS that are arranged at the same height (or order) from the substrate SUB or the ground selection transistor GST may be electrically connected to each other. Gates of the memory cells of the cell strings CS that are arranged at different heights (or orders) from the substrate SUB or the ground selection transistor GST may be electrically separated from each other. In FIG. 5, the gates of the memory cells of the same height are illustrated as being connected to the same word line. However, in some embodiments, the gates of the memory cells of the same height may be directly connected to each other in a plane where the memory cells are formed or may be indirectly connected to each other through another layer such as a metal layer.

Memory cells that correspond to a string (or ground) selection line and a word line may constitute a page. A write operation and a read operation may be performed by the page. In each page, each memory cell may store two or more bits. The two or more bits that are written in each of the memory cells belonging to one physical page may form two or more logical pages. For example, k-th bits that are respectively written in memory cells of each page may form a k-th logical page.

The memory block BLKa may be a three-dimensional (3D) memory array. The 3D memory array may be monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In some embodiments of the inventive concepts, the 3D memory array may include vertical NAND strings (or cell strings) that are vertically oriented such that at least one memory cell is located over another memory cell. The at least one memory cell may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 6:
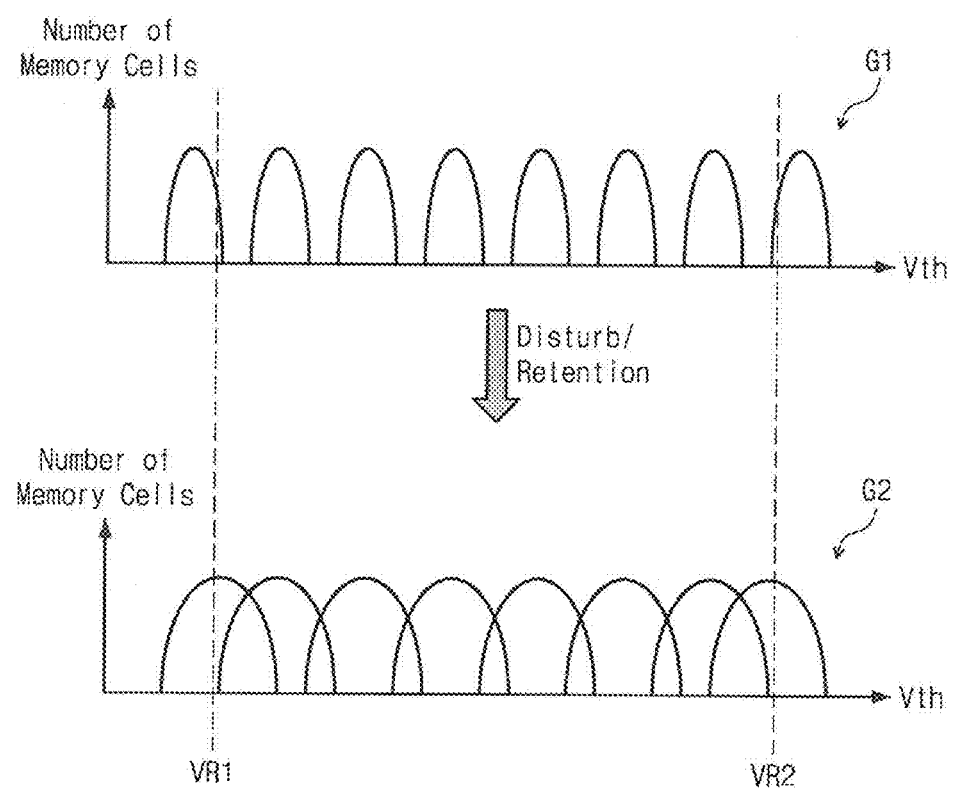
FIG. 6 is a flowchart of graphs illustrating methods in which a controller accesses a nonvolatile memory device according to some embodiments of the inventive concepts.

FIG. 6 is a flowchart of graphs illustrating methods in which a controller accesses a nonvolatile memory device according to some embodiments of the inventive concepts. In first and second graphs G1 and G2 of FIG. 6, the abscissa represents threshold voltages of memory cells, and the ordinate represents the number of memory cells. In FIG. 6, it is assumed that three bits are written in each memory cell and one page has three logical pages. However, embodiments of the inventive concepts may not be limited thereto.

Referring to FIGS. 1 and 5 and the first graph G1 of 6, each of memory cells may have eight states. The eight states may be defined by a threshold voltage range. As three bits are written in each memory cell, each memory cell may be programmed to have a threshold voltage Vth belonging to one of the eight states. The eight states may be distinguished by using seven read voltages the levels of which are within a range of eight threshold voltage distributions.

Disturbance and retention deterioration may occur after data are written in memory cells. The disturbance refers to a phenomenon in which threshold voltages of memory cells vary with programming, reading, erasing, coupling, etc. generated in a periphery of memory cells. The retention deterioration refers a phenomenon in which threshold voltages of memory cells vary as charges trapped in charge trap layers of the memory cells through a program operation are discharged over time.

In general, the disturbance and retention deterioration may cause an increase in threshold voltages of memory cells belonging to a low threshold voltage range and a decrease in threshold voltages of memory cells belonging to a high threshold voltage range. When the disturbance and retention deterioration occur, threshold voltages of memory cells may shift from the first graph G1 to the second graph G2.

Referring to the second graph G2, threshold voltages of memory cells belonging to different threshold voltage ranges may be mixed. For example, threshold voltages of memory cells belonging to a first threshold voltage range may shift to belong to a second threshold voltage range; in contrast, threshold voltages of memory cells belonging to the second threshold voltage range may shift to belong to the first threshold voltage range. When threshold voltages of memory cells vary as illustrated in the second graph G2, an error that is generated in a read operation may be uncorrectable by the error correction block 128.

A reliability verification read operation may be performed to prevent an uncorrectable error from being generated in the read operation. The reliability verification read operation may make use of read voltages, the number of which is less than the number of read voltages used in a general read operation. For example, the reliability verification read operation may include at least one of a first operation of performing first reading by using a first read voltage VR1 and a second operation of performing reading by using a second read voltage VR2. A change in a threshold voltage due to the disturbance or retention deterioration may be monitored by comparing the number of turned-on on-cells with a threshold value during the first operation. A change in a threshold voltage due to the disturbance or retention deterioration may be monitored by comparing the number of turned-off off-cells with the threshold value during the second operation.

The storage device 100 according to some embodiments of the inventive concepts may generate an access classifier by applying machine learning to the reliability verification read operation. On the basis of the access classifier, the controller 120 may in advance classify (or predict) a result of the reliability verification read operation.

FIG. 7 is a table illustrating access result information AI and access environment information EI when machine learning is applied to a reliability verification read operation according to some embodiments of the inventive concepts. Referring to FIGS. 1, 2, 6, and 7, the reliability verification read operation may be performed in the page corresponding to one string selection line and one word line.

The access environment information collection module 123_2 may collect at least one of a target block, a target string selection line, a target word line, a temperature, a time stamp, a program/erase count, an erase count, and a read count as the access environment information EI.

The target block may include an address of a memory block in which the reliability verification read operation is performed or information about a location of a target block among all memory blocks BLK1 to BLKz, for example, information indicating whether the target block is located at the center of the memory blocks BLK1 to BLKz or corresponds to the outermost memory block.

The target string selection line may include an address of a string selection line corresponding to a page in which the reliability verification read operation is performed or information about a location of the string selection line in the target block, for example, information indicating whether the string selection line is closer to the first string selection line SSL1 or to the fourth string selection line SSL4.

The target word line may include an address of a word line connected to a page in which the reliability verification read operation is performed or information about a location of the word line in the target block, for example, information about a height of the word line from the substrate SUB.

The temperature may be a temperature, for example of the storage device 100, when a reliability verification read operation is performed on the nonvolatile memory device 110 under control of the controller 120.

The time stamp may be a time when data is written in a page in which the reliability verification read operation is performed or a time that elapses after data is written.

The program/erase count may be a number of program/erase cycles that are performed on the target block.

The read count may be a number of times that a read operation is performed after data is written in the target block.

The information collection module 123_1 may collect at least one of information indicating whether the number of on-cells for the first read voltage VR1 is greater than a threshold value and/or information indicating whether the number of off-cells for the second read voltage VR2 is greater than a threshold value. For example, the threshold value for on-cells may be different from the threshold value for off-cells.

If the access environment information EI and the access result information AI are collected, the access classifier CF may be generated through machine learning. After the access classifier CF is generated, when the controller 120 intends to perform the reliability verification read operation on the nonvolatile memory device 110, result prediction may be previously made by using the access classifier CF before the reliability verification read operation is performed. For example, the access environment information collection module 123_2 may collect the environment information EI associated with an access to be performed. The classification module 123_4 may obtain the classification result CR by using the environment information EI and the access classifier CF.

If the reliability verification read operation is performed, the classification result CR may include information indicating whether the number of on-cells for the first read voltage VR1 is greater than a threshold value and/or information indicating whether the number of off-cells for the second read voltage VR2 is greater than a threshold value.

Figure 8:
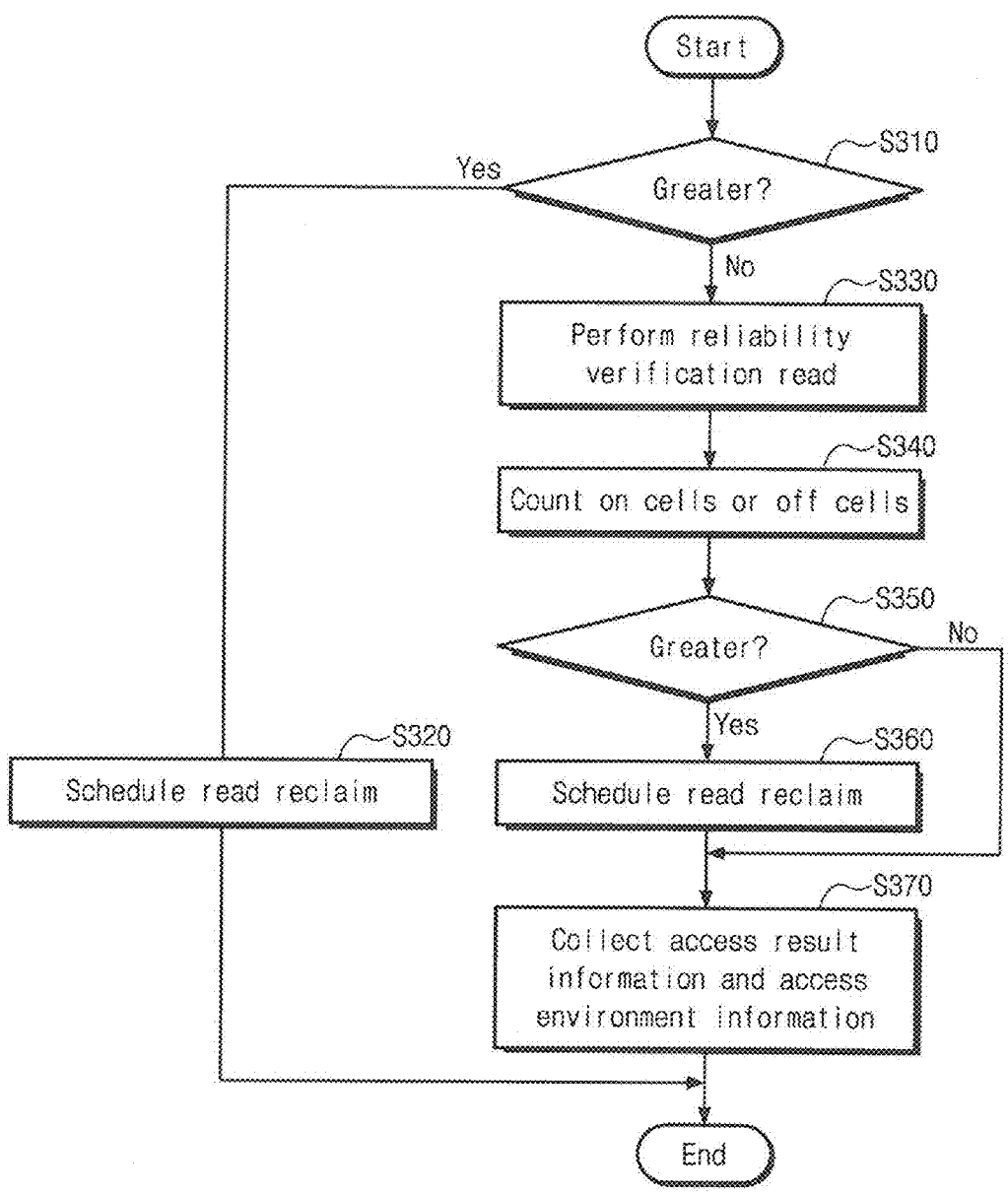
FIG. 8 is a flowchart illustrating operations of methods of processing a reliability verification read operation associated with a classification result after obtaining the classification result, according to some embodiments of the inventive concepts.

FIG. 8 is a flowchart illustrating operations of methods of processing a reliability verification read operation associated with the classification result after obtaining the classification result, according to some embodiments of the inventive concepts. Referring to FIGS. 1, 6, and 8, in an operation S310, whether a classification result CR indicates that a number of on-cells and/or a number of off-cells is greater than a threshold value may be determined. For example, the controller 120 or the cores 122 may determine whether all or one of the number of on-cells for the first read voltage VR1 and/or the number of off-cells for the second read voltage VR2 is greater than a threshold value.

If it is determined that the classification result CR indicates that the number of on-cells and/or the number of off-cells is greater than the threshold value, in an operation S320, the controller 120 or the cores 122 may schedule a read reclaim operation of a page of an access classification (i.e., reliability verification read operation) target or a read reclaim operation of a memory block, to which the page belongs. For example, the read reclaim operation may include reading data of a page or a memory block of the nonvolatile memory device 110 and writing the read data in another page or another memory block of the nonvolatile memory device 110. The disturbance and retention deterioration of data may be reduced or disappear by performing the read reclaim operation.

If the classification result CR indicates that the number of on-cells and/or the number of off-cells is not greater than the threshold value, the process may proceed to an operation S330. In the operation S330, the controller 120 may perform the reliability verification read operation on a page in which the access classification is made. In an operation S340, the controller 120 may count the number of on-cells for the first read voltage VR1 and/or the number of off-cells for the second read voltage VR2. Alternatively, the controller 120 may control the nonvolatile memory device 110 to allow the nonvolatile memory device 110 to count and output the number of on-cells and/or off-cells.

In an operation S350, the controller 120 may determine whether the on-cell count and/or the off-cell count is greater than a threshold value. If the on-cell count and/or the off-cell count is greater than the threshold value, an operation S360 and an operation S370 may be performed. If the on-cell count and/or the off-cell count is not greater than the threshold value, the operation S370 may be performed without the operation S360.

In the operation S360, the controller 120 may schedule a read reclaim operation of the page in which the reliability verification read operation of operation S330 was performed, or the memory block including the page. In the operation S370, the controller 120 or the cores 123 may collect the access result information AI and the access environment information EI.

In other words, the cores 122 may perform the reliability verification read operation on a target page of a target block in the nonvolatile memory device 110 based on the internal policy. Before the cores 122 perform the reliability verification read operation, the cores 122 may request the classification result CR from the cores 123. The cores 123 may collect the access environment information EI associated with the target page and may output the classification result CR based on the collected result. The classification result CR may predict whether the number of on-cells and/or the number of off-cells is greater than the threshold value.

If the classification result CR predicts that the number of on-cells and/or the number of off-cells is greater than the threshold value, that is, if the degree that data of memory cells are disturbed or degraded is predicted as being greater than the threshold value, the cores 122 may schedule the read reclaim without performing the reliability verification read operation. The reliability verification read operation may end without execution. As illustrated by the first arrow A1 of FIG. 2, related information may not be collected when the reliability verification read operation is not performed.

If the classification result CR indicates that the number of on-cells and/or the number of off-cells is not greater than the threshold value, that is, if the degree that data of memory cells are disturbed or degraded is predicted as being not greater than the threshold value, the cores 122 may control the nonvolatile memory device 110 such that the nonvolatile memory device 110 performs the reliability verification read operation. The cores 122 may determine whether to schedule the read reclaim operation based on the result of the reliability verification read operation. As illustrated by the second arrow A2 of FIG. 2, the access result information AI and the access environment information EI may be collected when the reliability verification read operation is performed.

FIG. 9 is a table illustrating access result information and access environment information when machine learning is applied to a read operation, a write operation, or an erase operation, according to some embodiments of the inventive concepts. Referring to FIGS. 1, 2, 4, and 9, the access environment information EI that is associated with the read operation, the write operation, or the erase operation may include at least one of a target block, a target string selection line, a target word line, a target logical page, a temperature, a time stamp, a program/erase count (or the number of program/erase cycles), and a read count. The access environment information EI may be the same as or similar to the access environment information EI of FIG. 7 except for the target logical page. Therefore, a description of similar portions thereof may be omitted for brevity.

The target logical page may include information about whether the target logical page belongs to any one of LSB, CSB, and MSB logical pages in the target page.

In some embodiments, the write operation may be performed by the page or by the logical page. When the write operation is performed by the page, the access environment information EI associated with the write operation may include at least one of the remaining information of the access environment information EI of FIG. 9 other than the target logical page. When the write operation is performed by the logical page, the access environment information EI associated with the write operation may include at least one of the access environment information EI of FIG. 9. The read operation may be performed by the logical page. The access environment information EI associated with the read operation may include at least one of the remaining information of the access environment information EI of FIG. 9 other than the target logical page. The erase operation may be performed by the memory block. The access environment information EI associated with the erase operation may include at least one of the remaining information of the access environment information EI of FIG. 9 other than the target word line, the target logical page, and the target string selection line.

The access result information AI associated with the read operation, the write operation, or the erase operation may include at least one of a read level, a read pass level, whether to perform soft decision, a bit error rate (BER), a program start level, an increment of a program voltage, a program pass level, the number of program loops, an erase start level, an increment of an erase voltage, and the number of erase loops.

The access result information AI that is collected in connection with the read operation may include a read level, a read pass level, whether to perform soft decision, and a bit error rate BER. The read level may be a level of a read voltage to be applied to a page, which is selected as a read target, through a word line. The read pass level may be a level of a read pass voltage to be applied to word lines corresponding to pages, which are not selected as a read target, of a memory block selected as a read target. Whether to perform soft decision may be whether to activate an operation, in which soft decision is performed by using read results that are obtained by performing a plurality of read operations on a selected page. The bit error rate BER may be a rate (or a number) of error bits that are detected after the error correction block 128 performs error correction decoding on data read from the nonvolatile memory device 110.

The access result information AI that is collected in connection with the write operation may include a program start level, an increment of a program voltage, a program pass level, and a number of program loops. The write operation may be performed by repeating a program loop. The program start level may be a level of a program voltage to be applied to a word line, which is selected as a write target, in a first program loop. The increment of the program voltage may be a voltage level by which the program voltage is increased upon repeating the program loop. The program pass level may be a level of the program pass voltage to be applied to word lines connected to pages that are not selected as a write target. The number of program loops may be the number of program loops that are repeated until memory cells of a selected page are completely programmed.

The access result information AI that are collected in connection with the erase operation may include an erase start level, an increment of an erase voltage, and the number of erase loops. The erase operation may be performed by repeating an erase loop. The erase start level may be a level of an erase voltage to be applied to a memory block, which is selected as an erase target, in a first erase loop. The increment of the erase voltage may be a voltage level by which the erase voltage is increased upon repeating the erase loop. The number of erase loops may be a number of erase loops that are repeated until memory cells of the selected memory block are completely erased.

If the access environment information EI and the access result information AI are collected, the access classifier CF may be generated through machine learning. After the access classifier CF is generated, when the controller 120 performs the write operation, the read operation, or the erase operation on the nonvolatile memory device 110, result prediction may be in advance made by using the access classifier CF before the write operation, the read operation, or the erase operation is performed. For example, the access environment information collection module 123_2 may collect the environment information EI associated with an access to be performed. The classification module 123_4 may obtain the classification result CR by using the environment information EI and the access classifier CF.

The classification result CR may include at least one of a read level and a read pass level that cause a less error upon performing the read operation, whether to perform soft decision upon performing the read operation, and a bit error rate BER predicted upon performing the read operation. On the basis of the classification result CR, the controller 120 may select a read level or a read pass level or may determine whether to perform soft decision. Also, on the basis of the bit error rate BER of the classification result CR, the controller 120 may determine whether to perform a read operation (e.g., the read operation is not performed when the bit error rate BER is greater than a threshold value) and whether to schedule a read reclaim operation of a selected page or a memory block including the selected page (e.g., the controller 120 schedules the read reclaim operation when the bit error rate BER is greater than a threshold value).

The classification result CR may include a program start level, an increment of a program voltage, a program pass level, or a number of program loops for improving the reliability of data, reducing a program time, or preventing a program fail when the write operation is performed. The controller 120 may select a program start level, an increment of a program voltage, or a program pass level, based on the classification result CR. Also, on the basis of the number of program loops of the classification result CR, the controller 120 may determine whether to perform a write operation (e.g., the write operation is not performed when the number of program loops is greater than a threshold value) or whether to classify a memory block including a selected page as a bad block (e.g., the controller 120 classifies a memory block as a bad block when the number of program loops is greater than a threshold value).

The classification result CR may include an erase start level, an increment of an erase voltage, or a number of erase loops. The number of erase loops may be a number of erase loops for improving the reliability of data, reducing an erase time, or preventing an erase fail when the erase operation is performed. The controller 120 may select a start level or an increment of an erase voltage, based on the classification result CR. Also, on the basis of the number of erase loops of the classification result CR, the controller 120 may determine whether to perform an erase operation (e.g., the erase operation is not performed when the number of erase loops is greater than a threshold value) and whether to classify a selected memory block as a bad block (e.g., the controller 120 classifies a memory block as a bad block when the number of erase loops is greater than a threshold value).

Figure 10:
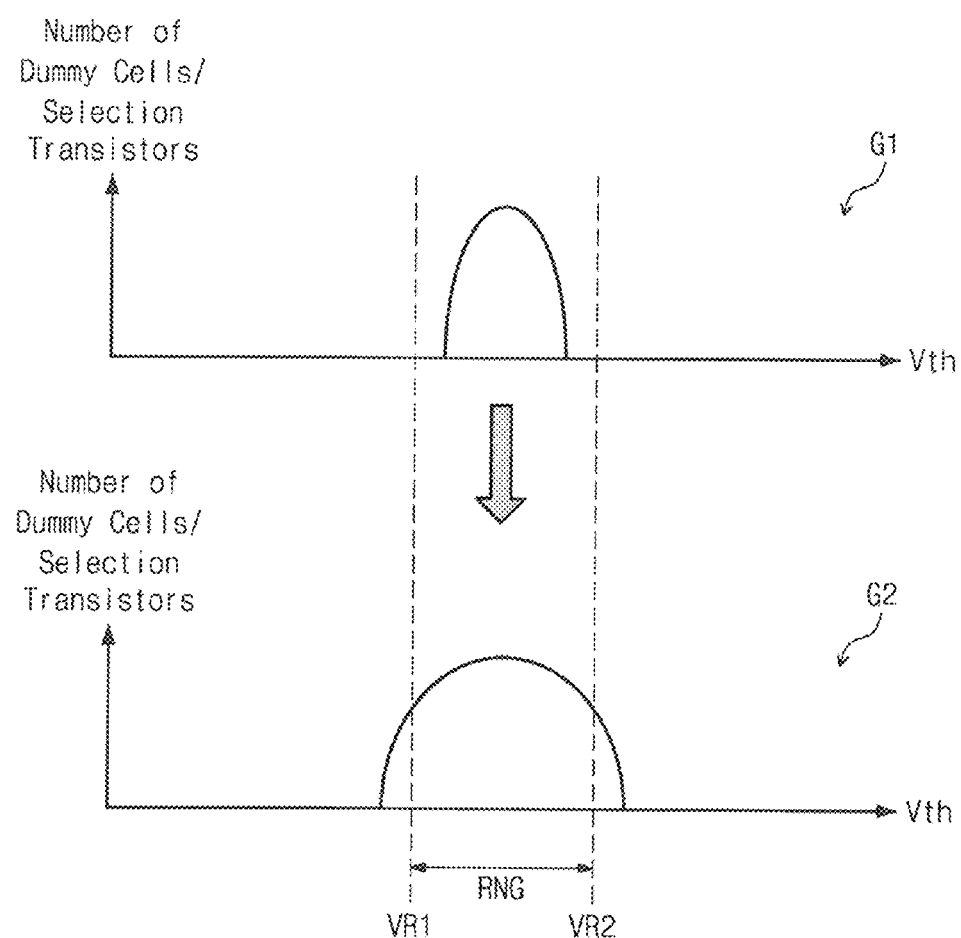
FIG. 10 is a flowchart of graphs illustrating methods in which a controller accesses a nonvolatile memory device according to some embodiments of the inventive concepts.

FIG. 10 is a flowchart of graphs illustrating methods in which a controller accesses a nonvolatile memory device according to some embodiments of the inventive concepts. In first and second graphs G1 and G2 of FIG. 10, the abscissa represents threshold voltages of dummy memory cells or selection transistors, and the ordinate represents a number of dummy memory cells or selection transistors.

Referring to FIGS. 1 and 5 and the first graph G1 of 10, each dummy memory cell or selection transistor may have one logical state that is defined by one threshold voltage range. The dummy memory cells may include the first and second dummy memory cells DMC1 and DMC2 of FIG. 5. The selection transistors may include the string selection transistors SST and the ground selection transistors of FIG. 5.

Disturbance and retention deterioration may occur after the dummy memory cells or the selection transistors are programmed. When the disturbance and retention deterioration occur, threshold voltages of the dummy memory cells or the selection transistors may shift from the first graph G1 to the second graph G2.

If a threshold voltage distribution of the dummy memory cells or the selection transistors widens, as illustrated by the second graph G2, amounts of cell currents that are generated upon writing, reading, or erasing memory cells may vary. Accordingly, threshold voltages of memory cells may be distributed to be wider, thereby causing a decrease in reliability of data written in the memory cells.

Threshold voltages of the dummy memory cells or the selection transistors may be checked to prevent threshold voltages thereof from widening as illustrated by the second graph G2. For example, with regard to threshold voltages of the dummy memory cells or the selection transistors, read operations may be performed by using the first read voltage VR1 and the second read voltage VR2. If read operations are performed by using the first read voltage VR1 and the second read voltage VR2, whether threshold voltages of the dummy memory cells or the selection transistors leave a range RNG defined by the first and second read voltages VR1 and VR2 may be checked.

The storage device 100 according to some embodiments of the inventive concepts may generate an access classifier by applying machine learning to an operation of checking threshold voltages of the dummy memory cells or the selection transistors. On the basis of the access classifier, the controller 120 may in advance classify (or predict) a result of the check operation.

FIG. 11 is a table illustrating access result information and access environment information when machine learning is applied to a check operation according to some embodiments of the inventive concepts. Referring to FIGS. 1, 2, 10, and 11, a check operation may be performed in units of selection transistors corresponding to one string selection line or one ground selection line or in units of dummy memory cells (e.g., by the dummy page) corresponding to one string selection line and one word line.

The access environment information collection module 123_2 may collect at least one of a target block, a target string selection line or target ground selection line, a target word line, a temperature, a time stamp, a program/erase count (or a number of program/erase cycles), and a read count. The access environment information EI about the dummy memory cells may include at least one of the access environment information EI of FIG. 11. The access environment information EI about the selection transistors may include at least one of the remaining information of the access environment information EI of FIG. 11 other than the target word line.

The access result information AI may include information about whether the number of dummy memory cells or selection transistors leaving the range RNG is greater than a threshold value.

If the access environment information EI and the access result information AI are collected, the access classifier CF may be generated through machine learning. After the access classifier CF is generated, when the controller 120 intends to perform the check operation on the nonvolatile memory device 110, result prediction may be in advance made by using the access classifier CF before the check operation is performed. For example, the access environment information collection module 123_2 may collect the environment information EI associated with the check operation to be performed. The classification module 123_4 may obtain the classification result CR by using the environment information EI and the access classifier CF. The classification result CR may include information about whether the number of dummy memory cells or selection transistors having threshold voltages leaving the range RNG is greater than the threshold value.

Figure 12:
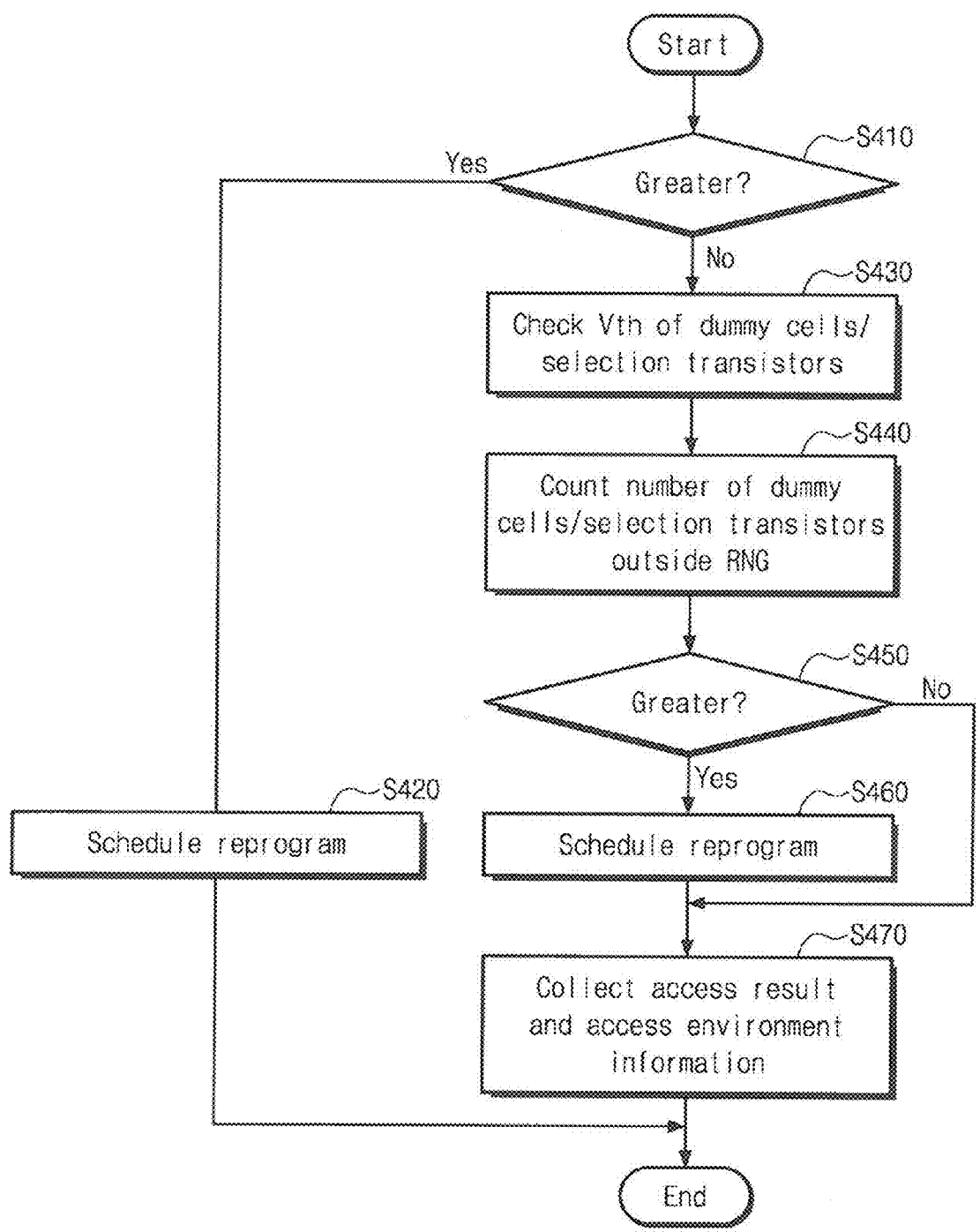
FIG. 12 is a flowchart illustrating operations of methods of processing a check operation associated with a classification result after obtaining the classification result according to some embodiments of the inventive concepts.

FIG. 12 is a flowchart illustrating operations of methods of processing a check operation associated with the classification result after obtaining the classification result according to some embodiments of the inventive concepts. Referring to FIGS. 1, 10, and 12, in an operation S410, whether the classification result CR indicates that the number of dummy memory cells or selection transistors is greater than a threshold value may be determined. For example, the controller 120 or the cores 122 may determine whether the number of dummy memory cells or selection transistors having threshold voltages leaving the range RNG is greater than a threshold value.

If it is determined that the classification result CR indicates that the number of dummy memory cells or selection transistors is greater than the threshold value, in an operation S420, the controller 120 or the cores 122 may schedule a reprogram operation of a memory block to which selection transistors or dummy memory cells of an access classification target (i.e., a check target) belong. For example, the reprogram operation may include increasing threshold voltages of selection transistors or dummy memory cells by programming the selection transistors or dummy memory cells, of which threshold voltages are lowered, or increasing the threshold voltages of the selection transistors or dummy memory cells by programming the selection transistors or dummy memory cells after erasing the selection transistors or dummy memory cells such that threshold voltages thereof are lowered.

If the classification result CR indicates that the number of selection transistors or dummy memory cells is not greater than the threshold value, the process may proceed to an operation S430. In the operation S430, the controller 120 may perform a check operation for checking threshold voltages of the selection transistors and/or the dummy memory cells. In an operation S440, the controller 120 may count the number of dummy memory cells or selection transistors having threshold voltages leaving the range RNG. Alternatively, the controller 120 may control the nonvolatile memory device 110 to allow the nonvolatile memory device 110 to count and output the number of dummy memory cells or selection transistors having threshold voltages leaving the range RNG.

In an operation S450, the controller 120 may determine whether the number of dummy memory cells or selection transistors having threshold voltages leaving the range RNG is greater than the threshold value. If the number of dummy memory cells or selection transistors is greater than the threshold value, an operation S460 and an operation S470 are performed. If the number of dummy memory cells or selection transistors is not greater than the threshold value, the operation S470 is performed without the operation S460.

In the operation S460, the controller 120 may schedule the reprogram operation of a memory block in which the check operation is performed. In the operation S470, the controller 120 or the cores 123 may collect the access result information AI and the access environment information EI.

FIG. 13 is a table illustrating results of access operations classified by using a result of a sub access operation as the access environment information according to some embodiments of the inventive concepts. In some embodiments, the sub access operation may be the reliability verification read operation described with reference to FIG. 6, and the access operation may be a read operation.

Referring to FIGS. 1, 2, 6, and 13, the access environment information EI may include information about a number of on-cells for the first read voltage VR1 and a number of off-cells for the second read voltage VR2 in a reliability verification read operation on a selected page. The access environment information EI may further include at least one of a target block, a target string selection line, a target word line, a temperature, a time stamp, a program/erase count (or a number of program/erase cycles), and a read count.

The access result information AI may include information about whether an error bit rate BER when a read operation is performed on a selected page exceeds a threshold value.

If the access environment information EI and the access result information AI are collected, the access classifier CF may be generated through machine learning.

Figure 14:
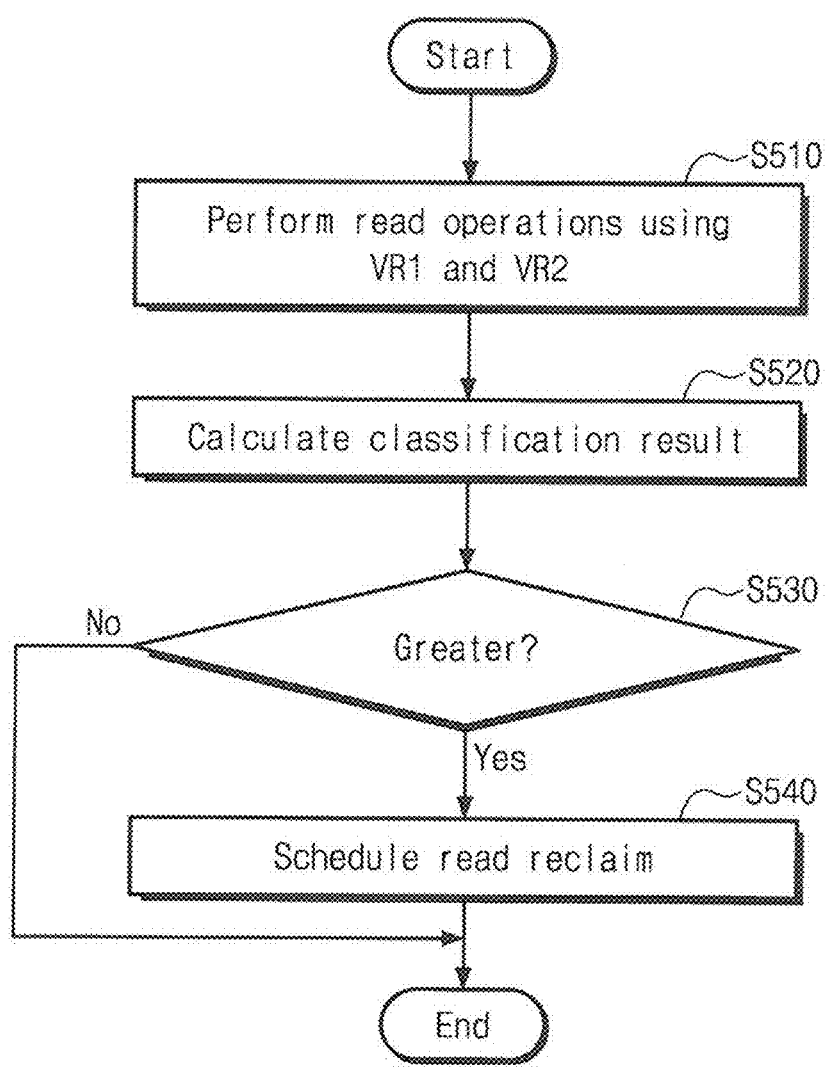
FIG. 14 is a flowchart illustrating operations of methods of using the access environment information and the access result information of FIG. 13 according to some embodiments of the inventive concepts.

FIG. 14 is a flowchart illustrating operations of methods of using the access environment information and the access result information of FIG. 13 according to some embodiments of the inventive concepts. In some embodiments, classification using the environment information EI and the access result information AI may be applied to a portion of a reliability verification read operation.

Referring to FIGS. 1, 13, and 14, in an operation S510, the controller 120 may perform a reliability verification read operation on the nonvolatile memory device 110. A number of on-cells and a number of off-cells that are obtained through the reliability verification read operation may be collected as the access environment information EI.

In response to performing the reliability verification read operation, in an operation S520, the access classifier CF may obtain the classification result CR by using the collected environment information EI. For example, the classification module 123_4 may predict (or classify) a rate of error bits (i.e., BER) that are generated upon performing not the reliability verification read operation but the read operation on a selected page. The classification result CR may include information about whether the bit error rate BER is greater than a threshold value.

In an operation S530, whether the classification result CR indicates that a bit error rate BER is greater than a threshold value may be determined. If the classification result CR indicates that the bit error rate BER is not greater than the threshold value, the reliability verification read operation ends. If the classification result CR indicates that the bit error rate BER is greater than the threshold value, in an operation S540, the controller 120 may schedule a read reclaim operation of a page selected as a reliability verification read target or a memory block including the selected page.

Compared with the embodiments illustrated in FIGS. 13 and 14, the embodiments illustrated in FIGS. 6 to 8 may determine whether to perform the reliability verification read operation based on the access environment information EI before the reliability verification read operation is performed. In such embodiments, whether to schedule the read reclaim may be determined by comparing the number of on-cells and/or the number of off-cells with a threshold value.

In the embodiments illustrated in FIGS. 13 and 14, the reliability verification read operation may be performed and a result of the reliability verification read operation may be used as access environment information. In the reliability verification read operation, whether to schedule the read reclaim may be determined by classifying (or predicting) a bit error rate BER when a read operation is performed, based on the access environment information EI and comparing the bit error rate BER with a threshold value. That is, the classification may be used to determine whether to perform the read reclaim after the reliability verification read operation is performed.

In some embodiments, the reliability verification read operation may be randomly or periodically performed as the read operation is performed. The result of the reliability verification read operation and the result of a read operation corresponding to the reliability verification read operation may be collected as access environment information.

Figure 15:
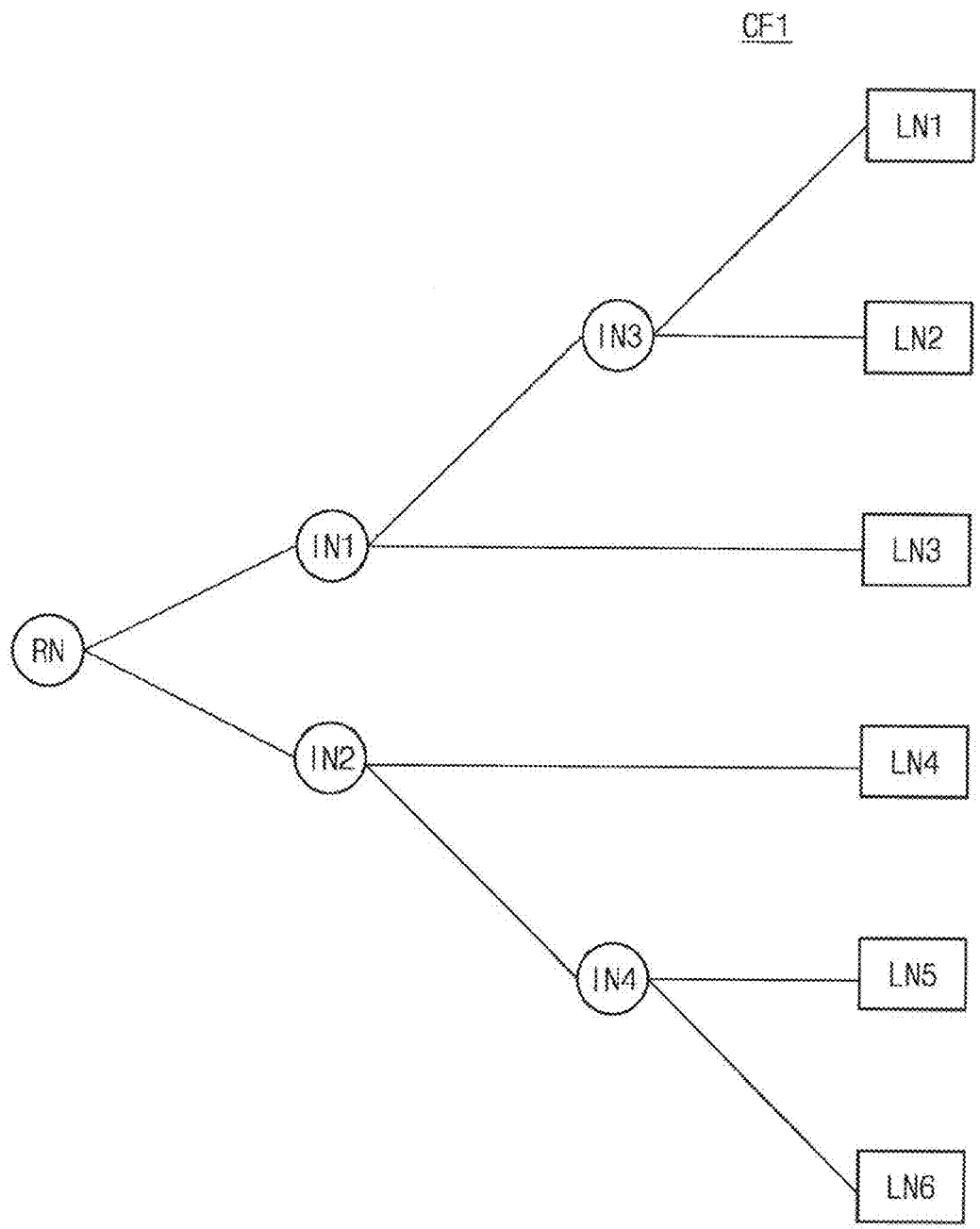
FIG. 15 is a graph of an access classifier generated by machine learning according to some embodiments of the inventive concepts.

FIG. 15 is a graph of an access classifier generated by machine learning according to some embodiments of the inventive concepts. In some embodiments, an access classifier CF1 may be a decision tree. Referring to FIGS. 1 to 15, an access classifier CF1 may include a root node RN, first to fourth internal nodes IN1 to IN4, and first to sixth leaf nodes LN1 to LN6. The root node RN, the first to fourth internal nodes IN1 to IN4, and the first to sixth leaf nodes LN1 to LN6 may be connected through branches.

In each of the root node RN and the first to fourth internal nodes IN1 to IN4, comparison may be made with respect to one of the access environment information EI. One of branches connected to each node is selected according to the comparison result. When another internal node has been connected to the selected branch, comparison may be made with respect to another one of the access environment information EI in an internal node. When a leaf node has been connected to the selected branch, a value of the leaf node may be obtained as the classification result CR. In some embodiments, information, which has the highest selectivity, of the access environment information EI may be compared with the access environment information EI in the root node RN.

Machine learning that is based on collected information may include determining a comparison value that is compared with the access environment information EI in each of the root node RN and the first to fourth internal nodes IN1 to IN4.

An initial access classifier CF1 may be stored in the storage device 100 when the storage device 100 is manufactured and sold. For example, the initial access classifier CF1 may be generated based on the access result information AI and the access environment information EI that are collected from a plurality of users by a manufacturer of the storage device 100. The initial access classifier CF1 may be viewed as being generated by 'off-line' learning, in that the initial access classifier CF1 may be generated by previously collected information.

While the storage device 100 is being used by a user after being sold, the access classifier CF1 may be consistently updated by the access environment information EI and the access result information AI of the user. Updating of the access classifier CF1 may be made by machine learning through which a comparison value that is compared with the access environment information EI in each of the root node RN and the first to fourth internal nodes IN1 to IN4 is updated. Since the access classifier CF1 may be updated by using real-time access result information AI and real-time access environment information EI by the user after the storage device 100 is sold, the access classifier CF1 may be updated by 'on-line' learning.

Figure 16:
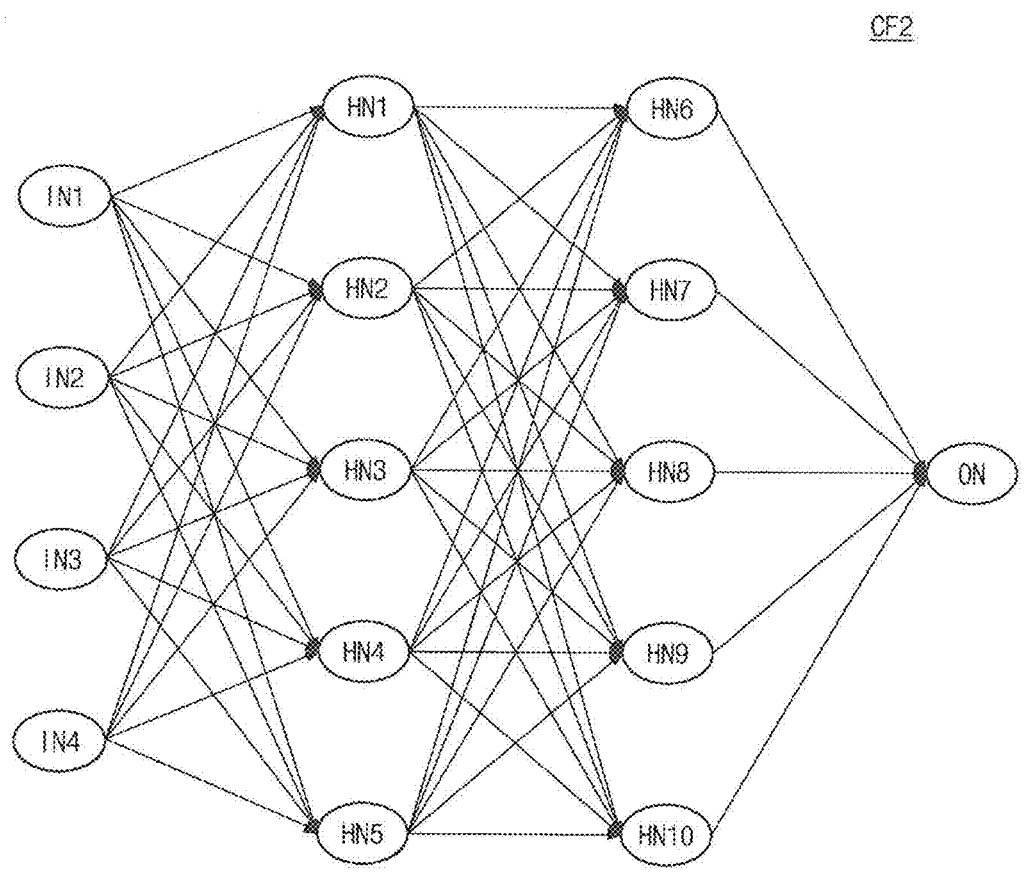
FIG. 16 is a graph of an access classifier generated by machine learning according to some embodiments of the inventive concepts.

FIG. 16 is a graph of an access classifier generated by machine learning according to some embodiments of the inventive concepts. In some embodiments, an access classifier CF2 may be a neural network. Referring to FIGS. 1 to 16, the access classifier CF2 may include first to fourth input nodes IN1 to IN4, first to tenth hidden nodes HN1 to HN10, and an output node ON. The number of input nodes, the number of hidden nodes, and the number of output nodes may be determined in advance upon constructing the neural network.

The first to fourth input nodes IN1 to IN4 may form an input layer. The first to fourth hidden nodes HN1 to HN5 may form a first hidden layer. The sixth to tenth hidden nodes HN6 to HN10 may form a second hidden layer. The output node ON may form an output layer. The number of hidden layers may be determined in advance upon constructing the neural network.

The access environment information EI may be input to the first to fourth input nodes IN1 to IN4. Access environment information of different kinds may be input to different input nodes.

The access environment information EI of each input node may be transferred to the first to fifth hidden nodes HN1 to HN5 of the first hidden layer with weights. An input of each of the first to fifth hidden nodes HN1 to HN5 may be transferred to the sixth to tenth hidden nodes HN6 to HN10 of the second hidden layer with weights. Inputs of the sixth to tenth hidden nodes HN6 to HN10 may be transferred to the output node ON with weights.

Machine learning may be performed by repeatedly updating weights based on a difference between a value of the output node ON, which is obtained upon inputting the access environment information EI to the first to fourth input nodes IN1 to IN4, and the access result information AI obtained when access is performed.

The initial access classifier CF2 that is based on the neural network may be generated by the off-line learning and may be stored in the storage device 100. As the user makes use of the storage device 100, the access classifier CF2 that is based on the neural network may be updated by the on-line learning.

Figure 17:
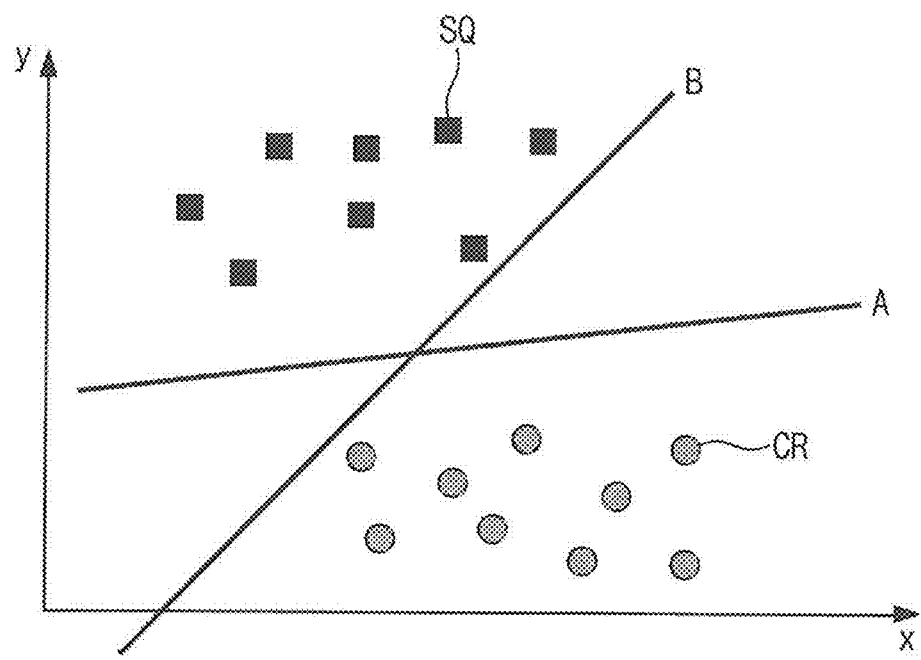
FIG. 17 is a graph of an access classifier generated by machine learning according to some embodiments of the inventive concepts.

FIG. 17 is a graph of an access classifier generated by machine learning according to some embodiments of the inventive concepts. In some embodiments, an access classifier CF may be a support vector machine. In FIG. 17, each of the abscissa "x" and the ordinate "y" indicates different access environment information EI. Shapes (square and circle) of samples distributed in FIG. 17 indicate different access result information AI.

Referring to FIGS. 1 and 17, line A and line B may be usefully used to classify square samples SQ and circle samples CR. However, considering probability of samples that will be collected later, the margin of line A may be greater than the margin of line B. For example, some of the square samples SQ and circle samples CR are closer to the line B than to the line A. The access classifier CF may select a classification criterion having a greater margin like line A.

The access classifier CF may have an initial classification criterion through off-line learning. The number of samples increases as the user makes use of the storage device 100, and the access classifier CF may update a classification criterion through on-line learning.

Figure 18:
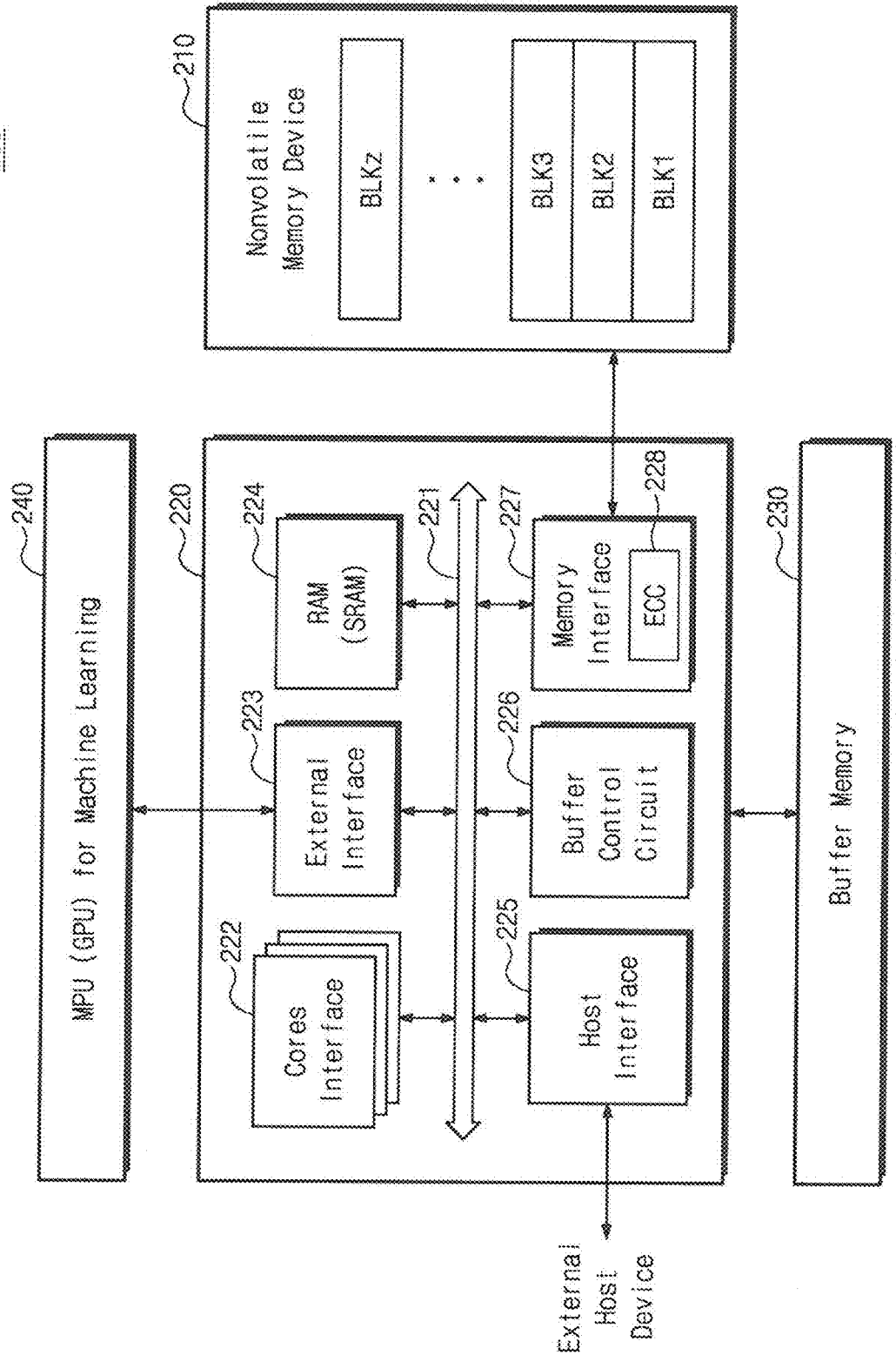
FIG. 18 is a block diagram illustrating an application of the storage device of FIG. 1 according to some embodiments of the inventive concepts.

FIG. 18 is a block diagram illustrating an application of the storage device of FIG. 1 according to some embodiments of the inventive concepts. Referring to FIGS. 1 and 18, a storage device 200 may include a nonvolatile memory device 210, a controller 220, a buffer memory 230, and a processing unit 240 for machine learning. The processing unit 240 may be a microprocessing unit (MPU) or a graphic processing unit (GPU).

The controller 220 may include a bus 221, cores 222, an external interface 223, a RAM 224, a host interface 225, a buffer control circuit 226, and a memory interface 227 including an error correction block 228.

In some embodiments, the cores 222 of the controller 220 may not be directly used to perform machine learning. Instead, the controller 220 may include an external interface 223 for communicating with the processing unit 240 that is separately provided on the outside of the controller 220. The cores 222 may request the machine learning from the processing unit 240 through the external interface 223. Also, the cores 222 may request the classification result CR from the processing unit 240 through the external interface 223.

According to embodiments of the inventive concepts, a method in which a controller accesses a nonvolatile memory device may be adjusted according to machine learning.

Accordingly, it may be possible to provide a storage device and an access method of a nonvolatile memory device, which provide improved or optimum operating performance to users by being adaptive to patterns of the users.

While the inventive concepts have been described with reference to some embodiments, various changes and modifications may be made without departing from the spirit and scope of the inventive concepts. Therefore, it should be understood that the above embodiments are not limiting, but illustrative.

What is claimed is:
1. A storage device comprising:
 a nonvolatile memory device;
 a buffer memory; and
 a controller configured to, perform operations including:
  performing first accesses, on the nonvolatile memory device using the buffer memory;
  collecting access result information and access environment information of the first accesses in the buffer memory; and
  generating an access classifier that indicates a prediction of a result of a performance of a second access to the nonvolatile memory device by performing machine learning based on the access result information and the access environment information collected in the buffer memory.
2. The storage device of claim 1, wherein when generating the access classifier, the controller is configured to update a previous access classifier based on the access result information and the access environment information.
3. The storage device of claim 1, wherein the controller is configured to perform the machine learning in response to:
 an occurrence of a predetermined time period;
 a determination that a size of the collected access result information and the collected access environment information reaches a predetermined size;
 an occurrence of an idle time;
 a detection of a power-off; and/or
 a determination that a storage capacity of the buffer memory is insufficient.
4. The storage device of claim 1, wherein the controller is configured to release the collected access result information and access environment information applied to the machine learning from the buffer memory after performing the machine learning.
5. The storage device of claim 1,
 wherein the first accesses and the second access are reliability verification read operations that determine a reliability of data stored in memory cells of the nonvolatile memory device, and
 wherein the reliability verification read operations comprise comparing a quantity of first memory cells having a threshold voltage lower than a first read voltage of memory cells selected from the memory cells of the nonvolatile memory device as a target of one of the reliability verification read operations and/or a quantity of second memory cells having a threshold voltage higher than a second read voltage of the selected memory cells to a threshold value.
6. The storage device of claim 5, wherein the access classifier indicates a prediction, before the second access is performed, of whether the quantity of the first memory cells and/or the quantity of the second memory cells is greater than the threshold value, based on further access environment information associated with the second access.
7. The storage device of claim 6, wherein the controller is configured to schedule a read reclaim operation on the selected memory cells based on the access classifier indicating a prediction that the quantity of the first memory cells and/or the quantity of the second memory cells is greater than the threshold value, without performing the second access.
8. The storage device of claim 6, wherein the controller is configured to perform the second access on the selected memory cells based on the access classifier indicating a prediction that the quantity of the first memory cells and/or the quantity of the second memory cells is smaller than the threshold value.
9. The storage device of claim 8, wherein the controller is configured to collect, in the buffer memory, further access result information based on the second access and the further access environment information based on the second access.
10. The storage device of claim 1, wherein the controller is configured to adjust one or more access parameters associated with the second access based on the prediction of the result and to control the nonvolatile memory device to perform the second access based on the adjusted access parameters.
11. The storage device of claim 10, wherein the access parameters comprise a read level, a read pass level, a parameter indicating whether to perform a soft decision, a bit error rate, a program start level, an increment of a program voltage, a program pass level, a quantity of program loops, an erase start level, an increment of an erase voltage, and/or a quantity of erase loops.

12. The storage device of claim 1,
wherein the first accesses and the second access are read operations that determine threshold voltages of dummy memory cells or selection transistors of the nonvolatile memory device, and
wherein the read operations comprise comparing a quantity of first dummy memory cells or first selection transistors having threshold voltages that are not within a range defined by first and second read voltages of dummy memory cells or selection transistors selected as a target of one of the read operations to a threshold value.

13. The storage device of claim 12, wherein the controller is configured to schedule a reprogram operation on the selected dummy memory cells or the selected selection transistors based on the access classifier indicating a prediction that a quantity of the first dummy memory cells and/or a quantity of the first selection transistors is greater than the threshold value, without performing the second access.

14. The storage device of claim 1, wherein the second access comprises a read operation using first read voltages,
wherein each of the first accesses comprises a sub read operation using second read voltages fewer than the first read voltages, and
wherein the access result information comprises whether a bit error rate of the second access is greater than a threshold value.

15. The storage device of claim 1, wherein the access environment information comprises a target memory block, a target string selection line, a target word line, a height of the target word line, a temperature, a time stamp, a program/erase count, a read count, a target logical page, and/or access results of sub accesses respectively associated with the first accesses.

16. The storage device of claim 1,
wherein the controller comprises a plurality of cores, and
wherein the controller is configured to use one or more of the plurality of cores to manage the storage device and to use a remaining one or more of the cores to perform the machine, learning.

17. The storage device of claim 1, further comprising:
an external processing unit of the controller,
wherein the controller is configured to request the external processing unit to perform the machine learning.

18. The storage device of claim 1, wherein the controller is configured to store the access classifier in a memory block of the nonvolatile memory device that is allocated for storing metadata.

19. A storage device comprising:
a nonvolatile memory device;
a buffer memory;
a controller configured to perform first accesses on the nonvolatile memory device using the buffer memory; and
a processing unit configured to collect access result information and access environment information of the first accesses in the buffer memory and to generate an access classifier indicating a prediction of a result of a performance of a second access to the nonvolatile memory device by performing machine learning based on the access result information and the access environment information collected in the buffer memory,
wherein the controller is configured to selectively perform the second access on the nonvolatile memory device based on the access classifier.

* * * * *